United States Patent [19]

Misic et al.

[11] Patent Number: 4,740,751
[45] Date of Patent: Apr. 26, 1988

[54] WHOLE BODY MRI RESONATOR

[75] Inventors: George J. Misic, Novelty; John L. Patrick, Solon, both of Ohio

[73] Assignee: Picker International, Inc., Highland Hts., Ohio

[21] Appl. No.: 894,313

[22] Filed: Aug. 7, 1986

Related U.S. Application Data

[63] Continuation-in-part of Ser. No. 641,570, Aug. 16, 1984, Pat. No. 4,634,980.

[51] Int. Cl.$^4$ .................................... G01R 33/20
[52] U.S. Cl. ............................ 324/318; 324/322; 333/219
[58] Field of Search ............ 324/300, 307, 309, 316, 324/318, 322; 333/219

[56] References Cited

U.S. PATENT DOCUMENTS

| | | |
|---|---|---|
| 3,427,532 | 2/1969 | Nelson . |
| 3,783,419 | 1/1974 | Lafond et al. ............... 333/82 |
| 4,388,601 | 6/1983 | Sneed et al. ............... 333/227 |
| 4,439,733 | 3/1984 | Hinshaw et al. ............... 324/322 |
| 4,506,224 | 3/1985 | Krause ............... 324/319 |
| 4,641,097 | 2/1987 | Bottomley ............... 324/318 |

OTHER PUBLICATIONS

"Slotted Tube Resonator: A New NMR Probe Head at High Observing Frequencies" by H. J. Schneider and P. Dullenkopf *Rev. Sci. Ins.* vol 48 No. 1 Jan. 77.
"Crossed Slotted Tube Resonator (CSTR)–A New Double Resonance NMR Probehead" by H. J. Schneider and P. Dullenkopf *Rev. Sci. Inst.* vol. 48, No. 7 Jul. 1977.
"The NMR Receiver: A Description and Analysis of Design" by D. I. Hoult *Progress in NMR Spectrometry*, 1978, vol. 12, pp. 41–77.
"An Efficient Decoupler Coil Design which Reduces Heating in Conductive Samples in Superconducting Spectrometers" by D. Alderman and D. Grant Journal of Mag. Res. 36, 447–451 (1979).
"The Slotted Cylinder: an Efficient Probe for NMR Imaging" by Willig, Darrasse, Taquin, and Sauzade.
"Ring Resonator RF Probes for Proton Imaging above 1 Telsa" by P. Roschmann.

*Primary Examiner*—Michael J. Tokar
*Attorney, Agent, or Firm*—Fay, Sharpe, Beall, Fagan, Minnich & McKee

[57] ABSTRACT

A resonator coil assembly (32) includes a dielectric sleeve (40) on which a first resonator coil portion (42) and a second resonator coil portion (44), each of copper foil, are adhered. The dielectric sleeve is dimensioned to receive a human torso therein and in one embodiment (FIG. 1) is circular in cross section and in another (FIG. 4) is elliptical in cross section. A pair of adjustable tuning capacitances (64, 66) and a pair of adjustable matching capacitances (68, 70) are interconnected between one end of the each coil portion and a metal bore liner (54). An opposite end of the coil portions are capacitively coupled to each other (FIG. 1) or to the bore liner (FIG. 3). A half wave length cable (72) interconnects the junctions between the first and second tuning and matching capacitances. One of these junctions is connected by a cable (74) with a radio frequency generator (30) and a radio receiver (34).

30 Claims, 5 Drawing Sheets

WHOLE BODY MRI RESONATOR

This application is a continuation-in-part of application Ser. No. 641,570, filed Aug. 16, 1984, and now U.S. Pat. No. 4,634,980.

BACKGROUND OF THE INVENTION

The present application relates to the art of magnetic resonance imaging. It finds particular application in conjunction with whole body resonators for medium and high field, particularly 1.5 Telsa, magnetic resonance imagers and will be described with particular reference thereto. It is to be appreciated, however, the invention may find broader application with resonators for spectrometers, with imagers adapted to other body parts, with higher and lower magnetic field strengths, and the like.

Heretofore, whole body magnetic resonance imaging apparatus have utilized a radio frequency resonator coil for inducing magnetic resonance in a region of the body of interest. Traditionally, the resonator included either distributed phase or saddle coils. Exemplary distributed phase coils and saddle coils are described in U.S. Pat. No. 4,439,733, issued Mar. 27, 1984 to Waldo S. Hinshaw, et al.

When performing proton magnetic resonance imaging in the range of 1.0 to 2.0 Tesla, a corresponding operating or resonance frequency of 40 to 90 megahertz is required. It is to be appreciated that the resonance frequency of the prior art coils varies with both their dimension and configuration. In order to attain the greater than 40 megahertz frequencies required for proton imaging at high field strengths, the saddle and distributed phase coils have been combined with distributed capacitance or scaled down to relatively small diameters. The distributed capacitance techniques lowered the coil quality. Reducing the diameter rendered the coil unsuitable for receiving the full body or torso of a human patient.

Other small diameter coil designs have been utilized to achieve resonance frequencies greater than 40 megahertz. However, the resonance frequency drops as these smaller diameter resonators are scaled up to dimensions suitable for receiving the torso of a human patient therein. For example, "Slotted Tube Resonator: A New NMR Probe Heat at High Observing Frequencies" by H. J. Schneider and P. Dullenkopf, *Rev. Sci. Inst.*, 48, No. 1, 68–73 Jan. (1977) discloses a slotted tube resonator which is about 10 mm in diameter. Because the length to diameter ratio is in excess of 10 to 1, such a coil is not amenable to enlargement to whole body diameters. Schneider and Dullenkopf also disclose a crossed, slotted tube resonator in "Crossed Slotted Tube Resonator (CSTR) A New Double Resonance NMR Probe Head", *Rev. Sci. Inst.*, 48, No. 7, 832–834 July (1977). A further description of magnetic resonance resonators is provided by D. I. Hoult in "The NMR Receiver: A Description and Analysis of Design", Progress in NMR Spectroscopy, 12, 41–77 (1978). The Hoult article discloses a coil which has a high frequency but which design is non-symmetric and unbalanced. A variation on these coils is shown by D. W. Alderman and D. M. Grant in "An Efficient Decoupler Coil Design Which Reduces Heating In Conductive Samples in Super-conducting Spectrometers", *J. Mag. Res.* 36, 447–451 (1979). A. Leroy-Willig, et al. in "The Slotted Cylinder: An probe for NMR Imaging", (1984) disclose a configuration which converts the quarter wave length Alderman and Grant slotted tube resonator into a half wave length coil. Another half wave length resonator is disclosed by P. Roschman, "Ring Resonator for RF Probes for Proton Imaging Above 1 Tesla", Abstracts of S.M.R.M. 3rd Annual Meeting, 634–5 (1984).

In accordance with the present invention, a new and improved resonator is provided which can be constructed in sizes sufficiently larger to receive a human patient's torso, yet resonate at frequencies in excess of 40 megahertz.

SUMMARY OF THE INVENTION

In accordance with one aspect of the present invention, a magnetic resonance imaging apparatus is provided. A magnetic field generating means generates a polarizing magnetic field longitudinally through an image region. A resonator coil assembly includes first and second coil portions which are dimensioned to receive a human patient torso therein. First and second tuning capacitances are electrically connected with the first and second coil portions. First and second matching capacitors are electrically connected between the first and second tuning capacitors, respectively, and a ground assembly. A radio frequency lead is electrically connected with a junction between the first matching and tuning capacitances and a junction between the second matching and tuning capacitances.

In accordance with one more limited aspect of the invention, the ground assembly includes an electrically conductive liner which extends longitudinally along the image region and around the first and second coil portions.

In accordance with another aspect of the present invention, the resonator coil assembly includes a resonator coil former including a sleeve of dielectric material on which the first and second coil portions of a thin conductive foil are disposed.

In accordance with a more limited aspect of the invention, an annular grounded collar extends around the coil former and is longitudinally displaced from the first and second coil portions. The dielectric sleeve may have a circular, elliptical, or other cross section as may be appropriate for receiving a human torso therein.

In accordance with a yet more limited aspect of the invention, the tuning and matching capacitances are connected adjacent one end of the resonator coil portions in a linear relationship. An additional capacitive coupling is provided between the other end of each coil portion and the liner.

One advantage of the present invention is that it provides for whole body magnetic resonance imaging at frequencies at least as high as 40 to 90 megahertz.

Another advantage of the present invention is that it utilizes a half wave length balanced structure which achieves optimal field distribution with minimal effects on patient loading.

Another advantage of the present invention is that it provides an improved filling factor for the coil, particularly the elliptical coil which closely follows the cross sectional shape of the human body.

Yet another advantage of the present invention resides in the excellent radio frequency field homogeneity over a field of view commensurate in scale with the torso of a human patient.

Still further advantages will become apparent to those of ordinary skill in the art upon reading and understanding the following detailed description of the preferred embodiments.

BRIEF DESCRIPTION OF THE DRAWINGS

The present invention may take form in various components and arrangements of components. The drawings are only for purposes of illustrating an preferred embodiment of the invention and are not to be construed as limiting it.

DETAILED DESCRIPTION OF THE PREFERRED EMBODIMENTS

Figure 1:
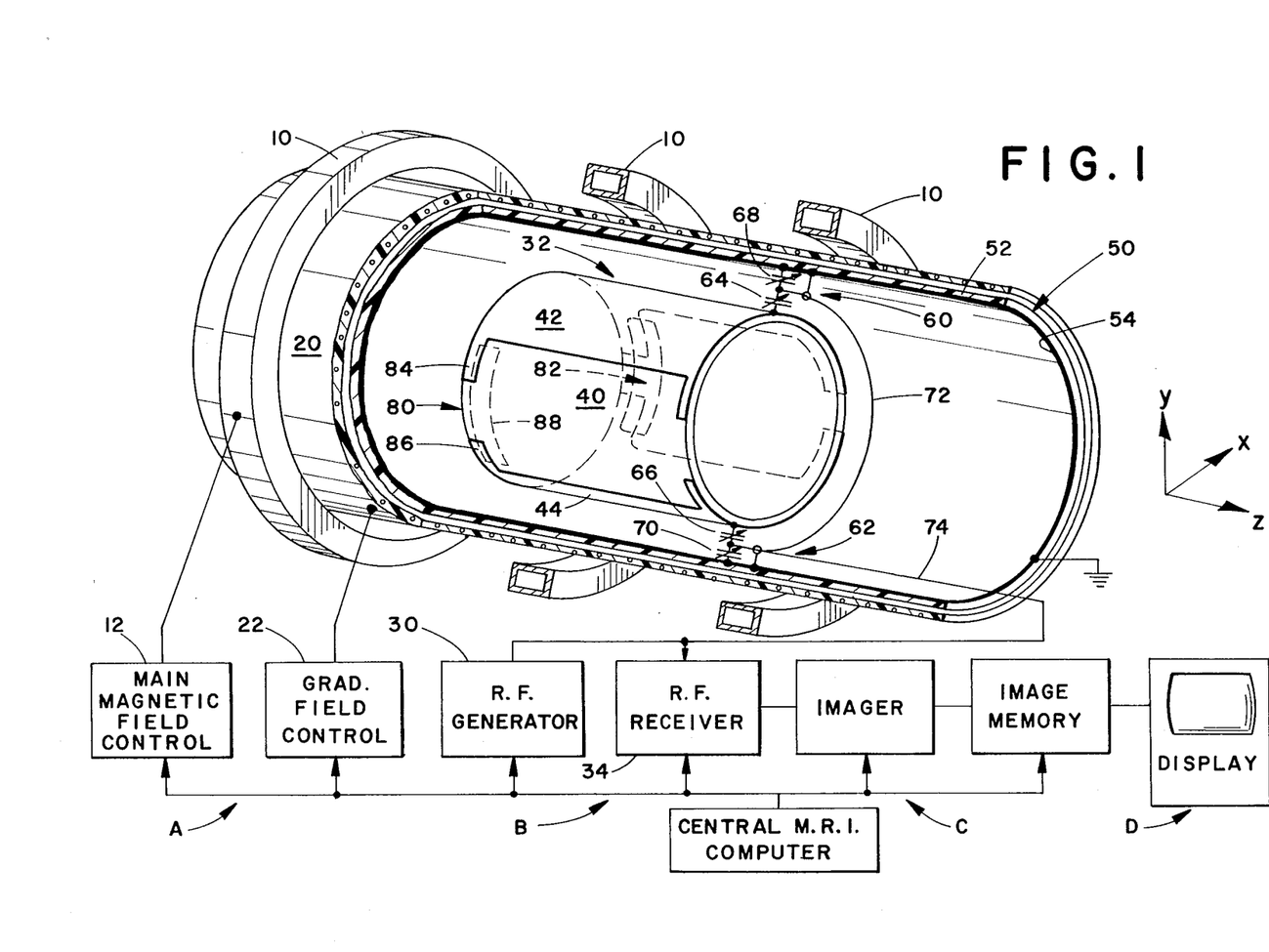
FIG. 1 is a diagrammatic view of a magnetic resonance imaging system in accordance with the present invention.

With reference to FIG. 1, a magnetic field generating means A generates a polarizing magnetic field generally longitudinally through an image region. The magnetic field may include transverse gradients for providing slice selection, phase encoding and spatial encoding. A radio frequency transmission and reception means B selectively excites magnetic resonance of hydrogen or other dipoles in the image region and receives resonance signals generated thereby. An image reconstruction means C applies Fourier transform or other image reconstruction techniques to generate images representations. The images may be displayed on a monitor D, recorded in memory, stored on tape, subject to further processing, or the like.

In the preferred embodiment, the magnetic field means A includes a plurality of main magnetic field magnets 10 operated under the control of a main magnetic field control means 12. The main magnetic field magnets and control generate a substantially uniform magnetic field longitudinally through the image region, commonly denoted as along a z-axis. A gradient coil 20 and a gradient field control means 22 selectively cause gradients in the main magnetic field, preferably relative to mutually orthogonal x and y axes.

The radio frequency means B includes a radio frequency generator 30 for generating appropriate radio frequency signals for exciting magnetic resonance, inverting spin angles, and the like, e.g. 90° and 180° pulses. The radio frequency signals are transmitted to hydrogen or other dipoles within the image region by a half-wave length, balance transmission resonator assembly 32. In the illustrated embodiment, the resonator coil assembly further acts as an antenna for picking up dipole generated magnetic resonance signals for a radio frequency receiver 34.

The resonator assembly 32 includes a resonator coil former 40 which, in the illustrated embodiment, is a plastic or other dielectric sleeve of a circular cross section extending longitudinally along the z-axis. Preferably, the former has about 1:1 length to diameter ratio. In order to accomodate a human patient's whole body, the diameter is about 60 cm. Optionally, the former may taper or decrease in diameter from a larger diameter at the shoulder toward a smaller diameter at the head or ankle ends.

The resonator assembly 32 further includes a first electrically conductive resonator coil portion 42 and a second coil portion 44. In the preferred embodiment, the coil portions are constructed of thin copper foil which is adhered or laminated to the surface of the dielectric former 40. The first and second coil portions are similarly saddle shaped, preferably as mirror images of each other about a horizontal plane extending midway therebetween. Each coil portion has a length along the z-axis which is about equal to the diameter of the resonator assembly.

A bore liner 50 includes a plastic or dielectric cylinder 52 to which an electrically conductive liner 54 is adhered or laminated. The conductive liner is preferably thin copper foil which is electrically connected with ground.

A first impedance matching network 60 and a second impedance matching network 62 are installed between the first and second resonator coil portions, respectively, and a grounding assembly, particularly the electrically conductive liner 54. The impedance matching networks include first and second tuning capacitances 64 and 66 which are connected with the first and second coil portions, respectively. First and second matching capacitances 68 and 70 are interconnected respectively between the first and second matching capacitances and the electrically conductive liner. A first junction is defined at the interconnection of the first tuning and matching capacitances and a second junction is defined at the interconnection of the second tuning and matching capacitances. A half wave length coaxial balun is fashioned from a coaxial cable 72 and is connected between the first and second junctions. A 50 ohm coaxial feed 74 is interconnected between one of the junctions and the radio frequency generator 30 and receiver 34.

The matching capacitances 68, 70 are each variable capacitances which are mechanically or electronically interconnected such that both are adjusted concurrently. Similarly, the tuning capacitances 64, 66 are variable capacitances which are interconnected to be adjusted concurrently. The tuning and matching capacitances of each network are connected in series between the electrically conductive liner 54 and a center edge point of each coil portion, i.e. the networks are connected diametrically oppositely and symmetrically with the resonator coil portions. The capacitors of the matching networks extend linearly and perpendicularly to the coil portions, e.g. along the horizontal or x-axis or as illustrated along the vertical or y-axis. Optionally, each matching network may include a center tapped adjustable capacitor.

Figure 2:
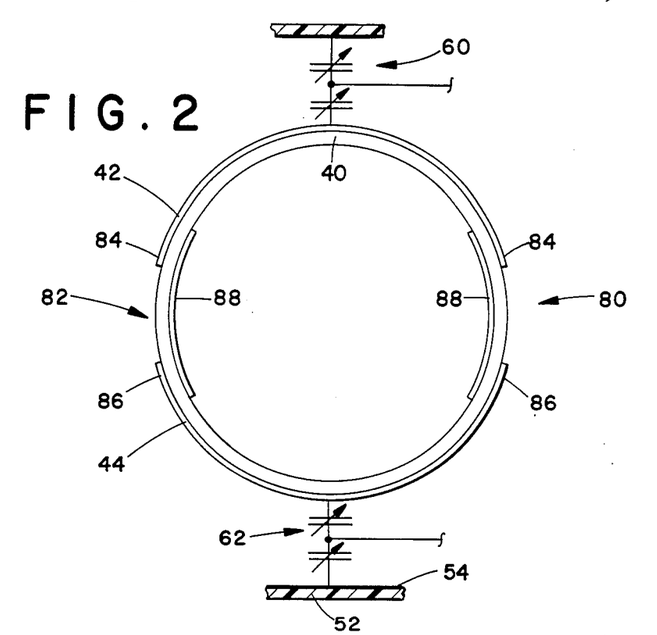
FIG. 2 is a rear end view illustrating a capacitive coupling arrangement for the resonator coil of the present invention.

First and second free end capacitive assemblies 80, 82 are defined at an opposite end of each coil portion from the matching networks. In the embodiment of FIGS. 1 and 2, each end capacitive assembly includes a pair of wings 84, 86 extending circumferentially from an end of the first and second coil portions. A copper foil or other electrically conductive segment 88 is mounted on the interior surface of the former 40 partially overlapping each wing such that the former functions as a dielectric therebetween. By selecting the length of the conductive strip 88 relative to the length of the wings 84, 86, the amount of overlap, hence, capacitive coupling, may be selected. If larger values of capacitance are required, the two discrete interior elements 88 may be extended, even into a complete integral ring. It is to be appreciated that the interior elements or rings will naturally be at the ground potential due to the symmetry of the resonator assembly. Alternatively the free end capacitance assemblies may include lumped capacitance elements.

In order to achieve optimal main field homogeneity, the capacitive loading at each end of the resonator coil is adjusted such that the zero voltage points of the first and second coil portions is at their physical centers. This tends to minimize dielectric losses at the center of the imaging plane. Optionally, a separate pick-up coil may be utilized and connected with the radio frequency receiver 34 for receiving the radio frequency signals. If the matching networks extend along the y-axis and the RF excitation field is generated along the x-axis, i.e. defining an x,y plane, then minimal coupling and interaction will occur between the resonator assembly and the second pick up when the second pick up is oriented to respond to a radio frequency field along the y-axis of the x,y plane.

In the embodiment of FIG. 1, the selected field pattern is produced by the wide central portions of the conductive coil portions 42, 44. However, a small current passes or leaks through the circular path provided by the capacitive assemblies 80, 82. This capacitor current produces x,z and y,z components in the magnetic field which disturb its uniformity in the image region. The uniformity degrading magnetic field components are eliminated with the capacitive assembly of the embodiment of FIG. 3 which breaks the circular current path.

Figure 3:
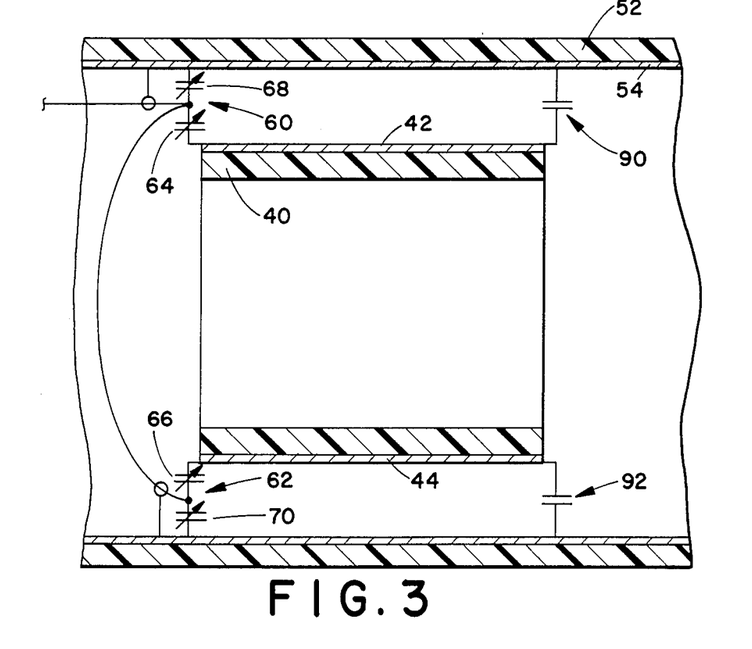
FIG. 3 is another capacitive coupling arrangement for a resonator coil in accordance with the present invention.

In FIG. 3, an alternate capacitive coupling assembly is described. The first and second matching networks 60 and 62 are interconnected between one end of the coil portions 42 and 44 and the electrically conductive liner 54 or other ground assembly. At the opposite end, a first capacitance 90 connects an opposite end of the first coil portion 42 with the liner 54. A second capacitance 92 which is disposed diametrically opposite to the first capacitance 90 interconnects the second coil portion 44 and the bore liner 54. In this manner, the bore liner 54 provides a return path such that the first and second resonator coil portions are capacitively coupled with ground and are not capacitively coupled directly with each other. This arrangement produces a field that is substantially in the x,y plane and is thus more effective at causing spin mutations than the FIG. 1 embodiment with its x,z and y,z field components. The coil portion to bore liner capacitive coupling is also applicable to lumbar spine surface coils in which only the lower half of the resonator is used.

Figure 4:
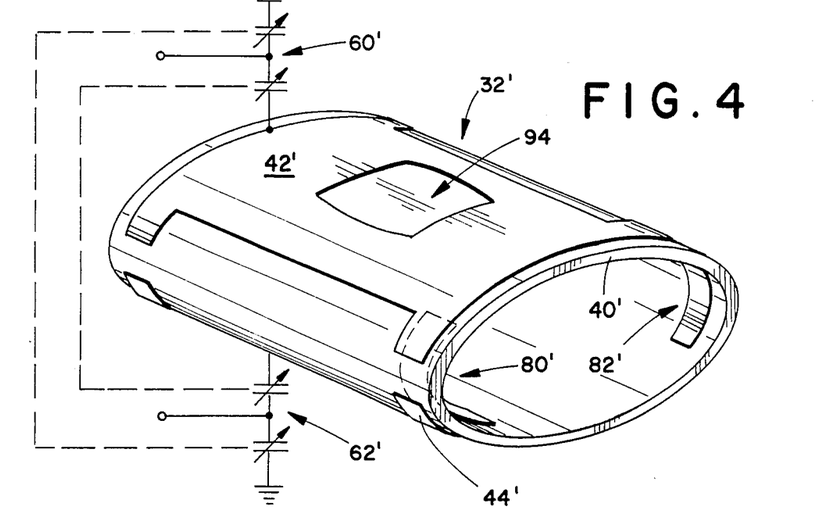
FIG. 4 is a perspective view of an alternate embodiment of the present invention in which the resonator coil is elliptical in cross section.

With reference to FIG. 4, an elliptical body resonator assembly 32' is provided. Because the human torso has a generally elliptical cross section, elliptical resonator achieves a greater filling factor when imaging the human torso. The greater filling factor provides greater sensitivity to magnetic resonance spins. The elliptical resonator assembly includes an elliptical dielectric former or sleeve 40' on which first and second electrically conductive coil portions 42' and 44' are adhered. Preferably, the coil portions are cut from copper foil with a generally rectangular shape. Wings may again be provided symmetrically adjacent the ends. A symmetrically disposed window 94 is removed centrally from the first coil portion to influence the magnetic field uniformity. A like window (not shown) is cut through the second coil portion. Optionally, other window configurations, such as a plurality of small windows, a plurality of slots, windows of other shapes, or the like, may be provided. Matching networks 60' and 62' are each interconnected between one end of each coil portions and a ground assembly. Capacitive couplings 80' and 82' capacitively couple the opposite ends of the coil portions.

Figure 5:
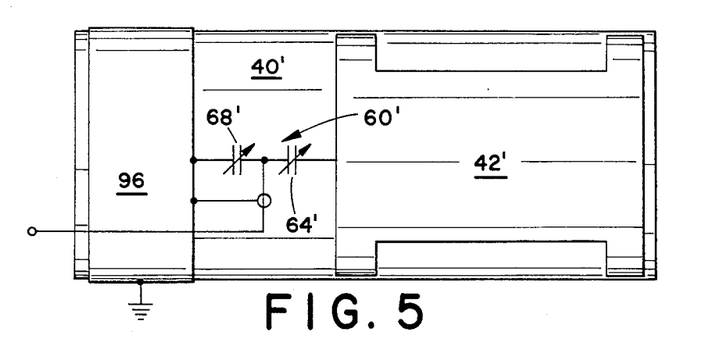
FIGS. 5 and 6 are top and side views, respectively, of an elliptical resonator coil in accordance with the present invention.
Figure 6:
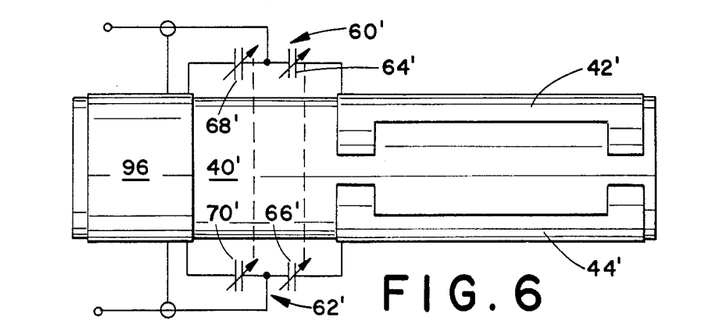

With reference to FIGS. 5 and 6, another embodiment of the grounding assembly is illustrated. Although illustrated in conjunction with the elliptical resonator assembly it is to be appreciated that the described grounding assembly is equally applicable to the circular resonator assembly. A dielectric former or sleeve 40' is elongated along the longitudinal or z-axis. First and second resonator coil portions 42' and 44' are symmetrically disposed adjacent one end of the dielectric former. An annular shorting collar 96 extends peripherally around the former adjacent the other end and is interconnected with ground. A first matching network 60' including parallel connected first tuning and matching capacitances 64', 68' interconnects one end of the first coil portion with the shorting collar. A second pair of series connected tuning and matching capacitances 66', 70' connects the same end of the second coil portion with the shorting collar. The matching networks are diametrically oppositely disposed and extend parallel to the longitudinal or z-axis. Capacitive coupling means capacitively couple the opposite ends of the coil portions either with each other or ground.

Figure 7:
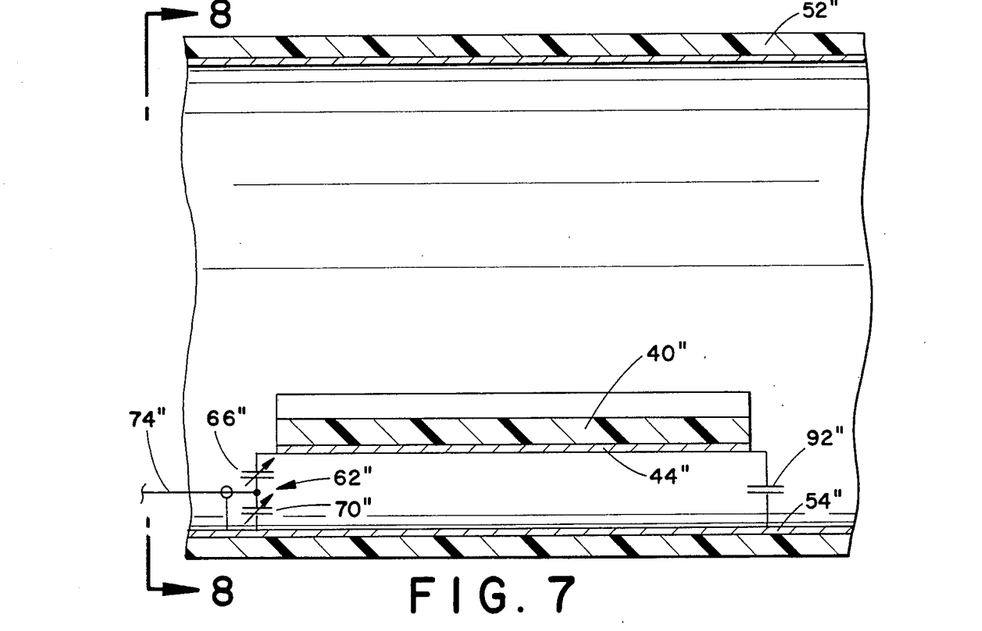
FIG. 7 is a side sectional view illustrating a lumbar support coil arrangement.
Figure 8:
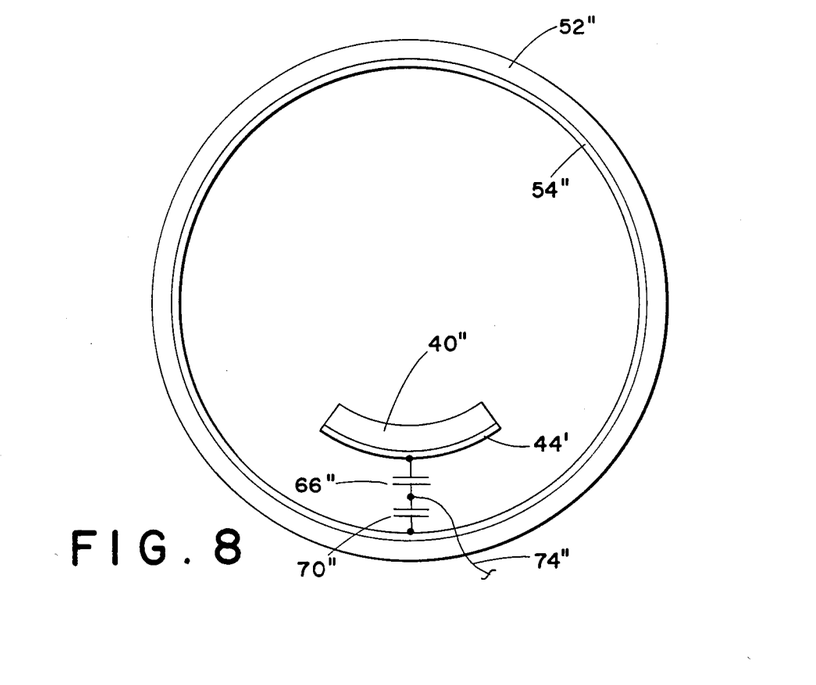
FIG. 8 is an end view of FIG. 7.
Figure 9:
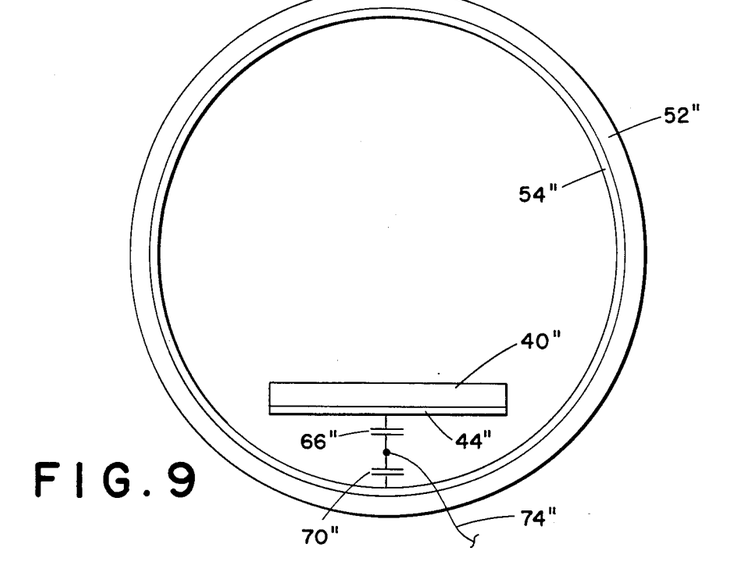
FIGS. 9 and 10 are end views illustrating alternate lumbar support coil arrangements.
Figure 10:
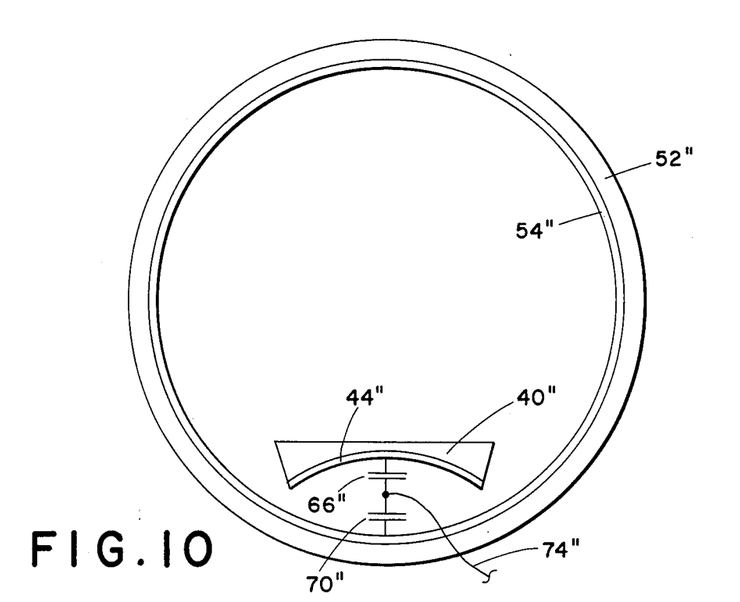

With reference to FIGS. 7 and 8, a lumbar spine surface coil arrangement is provided. An arcuate former portion 40" is shaped to conform with a patient's back. A coil portion 44" is adhered to one face of the former. At one end, a transmission cable 74" is coupled to an impedance matching network 62" including a tuning capacitance 66" and a matching capacitance 66"and a matching capacitance 70". A capacitive coupling 92" interconnects the other end of the coil portion with a bore liner 54". Optionally, as illustrated in FIGS. 9 and 10, the lumbar surface coil may include a planar former and coil portion or the coil portion may arc downward. The transverse arc may be a circular arc segment, an elliptical arc segment, or the like, as may be appropriate to selected homogeneity characteristics.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A magnetic resonance imaging apparatus comprising:
   a magnetic field means generating a magnetic field longitudinally through an image region;
   an electrically conductive liner extending longitudinally and around the image region;

a resonator coil assembly including a first coil portion and a second coil portion, the resonator coil assembly being disposed in the conductive liner;

first and second tuning capacitances electrically connected with the first and second coil portions, respectively;

first and second matching capacitances electrically connected between the first and second tuning capacitances, respectively, and the electrically conductive liner; and, a radio frequency lead electrically connected with (1) a first junction between the first matching and tuning capacitances and (2) a second junction between the second matching and tuning capacitances.

2. The apparatus as set forth in claim 1 wherein the first and second tuning capacitances are electrically connected with one end of the first and second coil portions and further including a capacitive coupling means operatively connected with opposite ends of the first and second coil portions.

3. The apparatus as set forth in claim 2 wherein the resonator coil assembly further includes a dielectric sleeve, the first and second coil portions being mounted on one surface of the sleeve and wherein the capacitive coupling means includes a conductive segment on another surface of the dielectric sleeve partially overlapping each of the first and second coil portions to form capacitive coupling therebetween.

4. The apparatus as set forth in claim 2 wherein the capacitive coupling means includes a first capacitance electrically connected between the first coil portion and the liner and a second capacitance connected between the second coil portion and the liner.

5. The apparatus as set forth in claim 4 wherein the first and second coil portions are symmetric about a longitudinally extending plane disposed therebetween and wherein the first and second tuning capacitance and the first and second matching capacitances are connected with the first and second coil portions along a line which is perpendicular to the first longitudinally extending plane such that a radio frequency pick up coil may be disposed parallel to the first longitudinally extending plane to receive magnetic resonance signals without interference with the first and second coil portions.

6. The apparatus as set forth in claim 2 further including a half wave length cable connected between an interconnection between the first tuning and matching capacitances and an interconnection between the second tuning and matching capacitances.

7. The apparatus as set forth in claim 6 wherein the first and second tuning capacitances are concurrently adjustable.

8. The apparatus as set forth in claim 6 wherein the first and second matching capacitances are concurrently adjustable.

9. The apparatus as set forth in claim 2 wherein the first and second coil portions are disposed along a cylindrical sleeve.

10. The apparatus as set forth in claim 2 wherein the first and second coil portions are disposed along an elliptical sleeve.

11. A magnetic resonance imaging apparatus comprising:

a magnetic field means generating a magnetic field longitudinally through an image region;

an electrically conductive liner extending longitudinally and around the image region;

a first coil portion disposed within the conductive liner and displaced therefrom;

a first impedance network electrically connected between a first end of the coil portion and the conductive liner;

a first capacitance means for defining electrical capacitance between a second end of the coil portion and the conductive liner;

a radio frequency lead operatively connected between the first impedance network and a receiver means for receiving magnetic resonance signals from the first coil portion; and, an image reconstruction means for reconstructing an image representation from the received magnetic resonance signals.

12. The apparatus as set forth in claim 11 wherein the first impedance network includes a tuning capacitance means for capacitively coupling the radio frequency lead and the first coil portion and a matching capacitance means for capacitively coupling the radio frequency lead and the conductive liner.

13. A magnetic resonance imaging apparatus comprising:

a magnetic field means for generating a magnetic field longitudinally through an image region;

a resonance coil former including a sleeve of dielectric material dimensioned to receive a human patient's torso therein, the former extending longitudinally along the magnetic field;

a first electrically conductive resonator coil portion disposed along the former;

a second electrically conductive resonator coil portion disposed along the former;

first and second matching capacitive networks, the first matching capacitive network being electrically connected between the first coil portion and a ground means and the second matching capacitive network being electrically connected between the second coil portion and the ground means; and, a radio frequency lead connected with at least the first matching capacitive network such that a capacitive coupling is provided between the radio frequency lead and the first coil portion.

14. The apparatus as set forth in claim 13 wherein the ground means includes a grounded annular collar extending around the former.

15. The apparatus as set forth in claim 13 wherein the former is elliptical in cross section.

16. The apparatus as set forth in claim 13 wherein the first and second coil portions are constructed of metal foil which is adhered to one surface of the former.

17. The apparatus as set forth in claim 13 wherein the former is circular in transverse cross section.

18. The apparatus as set forth in claim 17 wherein the first and second coil portions each define at least one window in the metal foil.

19. A magnetic resonance imaging apparatus comprising:

a magnetic field means for generating a magnetic field longitudinally through an image region;

a resonance coil former including a sleeve of dielectric material dimensioned to receive a human patient's torso therein, the former extending longitudinally along the magnetic field;

a first electrically conductive resonator coil portion disposed along the former;

a second electrically conductive resonator coil portion disposed along the former;
a first tuning capacitance electrically connected with the first coil portion;
a first matching capacitance operatively connected between the first tuning capacitance and a ground means;
a second tuning capacitance electrically connected with the second coil portion;
a second matching capacitance operatively connected between the second tuning capacitance and the ground means; and,
a half wave length cable which is connected at one end with a junction between the first matching and tuning capacitances and at its other end at a junction between the second matching and tuning capacitances.

20. The apparatus as set forth in claim 19 wherein the tuning and matching capacitances are adjustable.

21. The apparatus as set forth in claim 13 wherein the ground means includes a metal sleeve extending longitudinally along the magnetic field and surrounding the dielectric former and the first and second coil portions.

22. A whole body, half wave length balanced transmission line resonator comprising:
a dielectric sleeve having generally a 1:1 ratio between a length and a major diameter thereof;
a first metal foil portion extending along a surface of the dielectric sleeve;
a second metal foil portion extending along the surface of the dielectric sleeve, the first and second foil portions being mirror images of each other and electrically isolated from each other;
first and second matching capacitance networks for capacitively coupling one end of the first and second foil portions with ground;
a half wave length cable connected between the first and second capacitance networks; and,
a capacitance coupling means for capacitively coupling a second end of the first and second foil portions.

23. A magnetic resonance apparatus comprising:
a magnetic field means generating a magnetic field longitudinally through an image region;
an electrically conductive liner extending longitudinally and around the image region;
a lumbar supporting former disposed within the conductive liner;
a lumbar coil portion operatively connected with the lumbar supporting former;
an impedance network electrically connected with a first end of the lumbar coil portion, with the liner, and with a transmission lead;
a first capacitance means for defining electrical capacitance between a second end of the lumbar coil portion and the conductive liner.

24. The resonance apparatus as set forth in claim 23 wherein the lumbar supporting former conforms to a patient's back.

25. The resonance apparatus as set forth in claim 23 wherein the lumbar coil portion is generally planar.

26. The resonance apparatus as set forth in claim 23 wherein the lumbar coil portion is arcuate in transverse section.

27. The resonance apparatus as set forth in claim 23 wherein the impedance network includes a tuning capacitance connected between the transmission line and the lumbar coil portion and a matching capacitance connected between the transmission line and the liner.

28. The resonance apparatus as set forth in claim 23 wherein the lumbar coil portion includes a sheet of metal foil adhered to the former.

29. A magnetic resonance imaging apparatus comprising:
a magnetic field means for generating a magnetic field longitudinally through an image region;
a tubular, electrically conductive liner extending longitudinally and around the image region
a resonance coil former of dielectric material dimensioned to receive a human patient's torso therein, the former extending longitudinally along the magnetic field;
an electrically conductive resonator coil mounted on the former;
first matching capacitive network electrically connected between the resonator coil and the conductive liner.

30. A magnetic resonance imaging apparatus comprising:
a magnetic field means for generating a magnetic field longitudinally through an image region;
a resonance coil former of dielectric material dimensioned to receive a human patient's torso therein, the former extending longitudinally along the magnetic field;
a first electrically conductive resonator coil portion disposed along the former;
a second electrically conductive resonator coil portion disposed electrically along the former;
first and second matching capacitive networks, the first matching capacitive network being electrically connected between the first coil portion and a ground means and the second matching capacitive network being electrically connected between the second coil portion and the ground means; and,
a radio frequency conductor connected between the first and second matching capacitance networks.

* * * * *